United States Patent [19]
Uchida et al.

[11] Patent Number: 5,267,121
[45] Date of Patent: Nov. 30, 1993

[54] VENTILATION GUIDE FOR ELECTRONIC EQUIPMENT

[75] Inventors: Masahiro Uchida, Hiratsuka; Fumio Kishida, Isehara; Tamotsu Tsukaguchi, Hiratsuka, all of Japan

[73] Assignee: Hitachi, Ltd., Tokyo, Japan

[21] Appl. No.: 900,398

[22] Filed: Jun. 18, 1992

[30] Foreign Application Priority Data

Jun. 21, 1991 [JP] Japan ................................. 3-149090

[51] Int. Cl.⁵ ............................................ H05K 7/20
[52] U.S. Cl. .................................. 361/694; 165/80.3; 174/16.1; 361/796; 361/826
[58] Field of Search ..................... 361/379, 382–384, 361/390, 392, 415, 428; 62/345, 348, 352, 259.2; 165/80.3, 122; 174/15.1, 16.1

[56] References Cited

U.S. PATENT DOCUMENTS

| | | | |
|---|---|---|---|
| 3,371,975 | 3/1968 | Meltzer | 361/384 |
| 3,434,014 | 3/1969 | Taynton | 361/384 |
| 4,399,485 | 8/1983 | Wright | 361/384 |
| 5,173,819 | 12/1992 | Takahashi | 360/97.03 |

Primary Examiner—Gerald P. Tolin
Attorney, Agent, or Firm—Pennie & Edmonds

[57] ABSTRACT

In an electronic equipment having an exhaust duct for exhausting air heated in the equipment, and a cable lead-in portion which is disposed adjacent to the exhaust duct and through which external connector cables is to be led, a partition is disposed between the exhaust duct and the cable lead-in portion. The partition is movable so as to vary the area of an exhaust opening of the exhaust duct and the area of a lead-in opening of the cable lead-in portion.

9 Claims, 3 Drawing Sheets

VENTILATION GUIDE FOR ELECTRONIC EQUIPMENT

BACKGROUND OF THE INVENTION

1. Field of the Invention

This invention relates to an electronic equipment, and more particularly, to a ventilation guide for an electronic equipment having an air cooling mechanism, an exhaust portion for emitting air heated inside the equipment, and a cable lead-in portion which is disposed adjacent to the exhaust portion and through which external connector cables are to be led.

2. Description of the Related Art

FIG. 3 of the accompanying drawings shows a general structure of a conventional electronic equipment.

The conventional electronic equipment has a cooling fan 3 for cooling a printed circuit board 2, an exhaust duct 5 for emitting air heated due to heat generated by the printed circuit board 2, and a cable lead-in portion 9 which is disposed adjacent to the exhaust duct 5 and through which external connector cables 4 are to be led. Both the exhaust opening of the exhaust duct 5 and the opening of the cable lead-in portion 9 are located so as to confront a lower surface or floor on which the electronic equipment is installed. The exhaust duct 5 and the cable lead-in portion 9 are separated from each other by a partition 6. The external connector cables 4 are fastened jointly by a cable fastening bracket 8 mounted on the partition 6 and a cable holder 7 for holding the cables 4 against the cable fastening bracket 8.

With this conventional electronic equipment, if the number of external connector cables 4 is small, gaps between cables in the cable lead-in portion 9 would become large so that hot air emitted from the exhaust duct 5 flows backwardly into the cable lead-in portion 9 and gets recycled in the electronic equipment, thus lowering the cooling efficiency.

SUMMARY OF THE INVENTION

With a view to obviating the foregoing conventional problem, it is an object of this invention to provide an electronic equipment in which hot air emitted from an exhaust duct is prevented from flowing backwardly into the cable lead-in portion, thus maintaining a desired cooling efficiency.

According to one aspect of this invention, there is provided an electronic equipment having an exhaust portion for emitting air heated inside the equipment, and a cable lead-in portion which is disposed adjacent to the exhaust portion and through which external connector cables are to be led, the equipment further including a partition disposed between the exhaust portion and the cable lead-in portion, at least part of the partition being movable so as to vary the area of an exhaust opening of the exhaust portion and the area of a lead-in opening of the cable lead-in portion.

According to another aspect of the invention, there is provided an electronic equipment having a cable lead-in portion through which external connector cables are to lead, the equipment further including a movable plate disposed in the cable lead-in portion for varying an area of a lead-in opening of the cable lead-in portion.

With this arrangement, since the area of the opening of the cable lead-in portion can be varied according to the number of the external connector cables by moving at least part of the partition disposed between the exhaust portion and the cable lead-in partition, hot air emitted from the electronic equipment can be prevented from flowing backwardly into the equipment via the opening of the cable lead-in portion. It is therefore possible to prevent the cooling efficiency from being lowered due to the recycling of the hot air.

The same result can also be attained by the movable plate provided in the cable lead-in portion for varying the area of the opening of the cable lead-in portion.

DETAILED DESCRIPTION OF THE PREFERRED EMBODIMENTS

Figure 1:
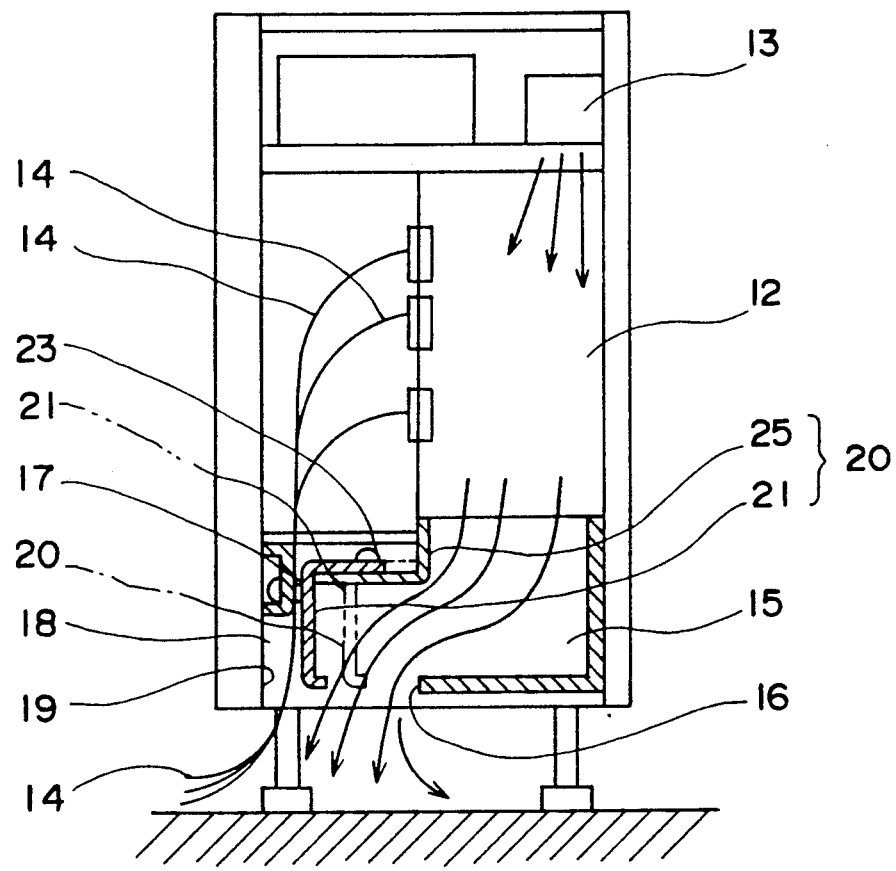
FIG. 1 is a cross-sectional view of an electronic equipment according to one embodiment of this invention.

An electronic equipment according to one embodiment of this invention will now be described with reference to FIGS. 1 and 2.

The electronic equipment of the embodiment as illustrated is a computer which has, inside a casing thereof, a cooling fan 13 for cooling a plurality of printed circuit boards 12 disposed therein. The computer also has an exhaust duct 15 for emitting air which has been heated inside the computer due to heat generated by the printed circuit boards 12, and a cable lead-in portion 18 disposed adjacent to the exhaust duct 15. A plurality of external connector cables 14 are to be led through the cable lead-in portion 18. An exhaust opening 16 of the exhaust duct 15 and an opening 19 of the cable lead-in portion 18 are located so as to confront a floor on which the equipment is installed. More specifically, the exhaust duct 15 opens at 16 to form an exhaust opening and the cable lead-in portion 18 opens at 19 on the floor of the equipment.

The exhaust duct 15 and the cable lead-in portion 18 are separated from each other by a partition 20. The partition 20 includes a stationary plate 25 fixed to an equipment frame, and a movable plate 21 movably supported on the stationary plate 25. The movable plate 21 has a horizontal portion and a vertical portion projecting downwardly from one edge of the horizontal portion. The horizontal portion of the movable plate 21 has in its opposite ends a pair of parallel slots 22, 22, respectively, so that the movable plate 21 can be moved in such a direction as to vary both the area of the opening 16 of the exhaust duct 15 and the area of the opening 19 of the cable lead-in portion 18. The movable plate 21 is fastened to the stationary plate 25 by screws 23, 23 extending through the respective slots 22, 22.

At the cable lead-in portion side of the movable plate 21, a cable holder 17 is disposed for holding the external connector cables 14 against the vertical portion of the movable plate 21.

Figure 2:
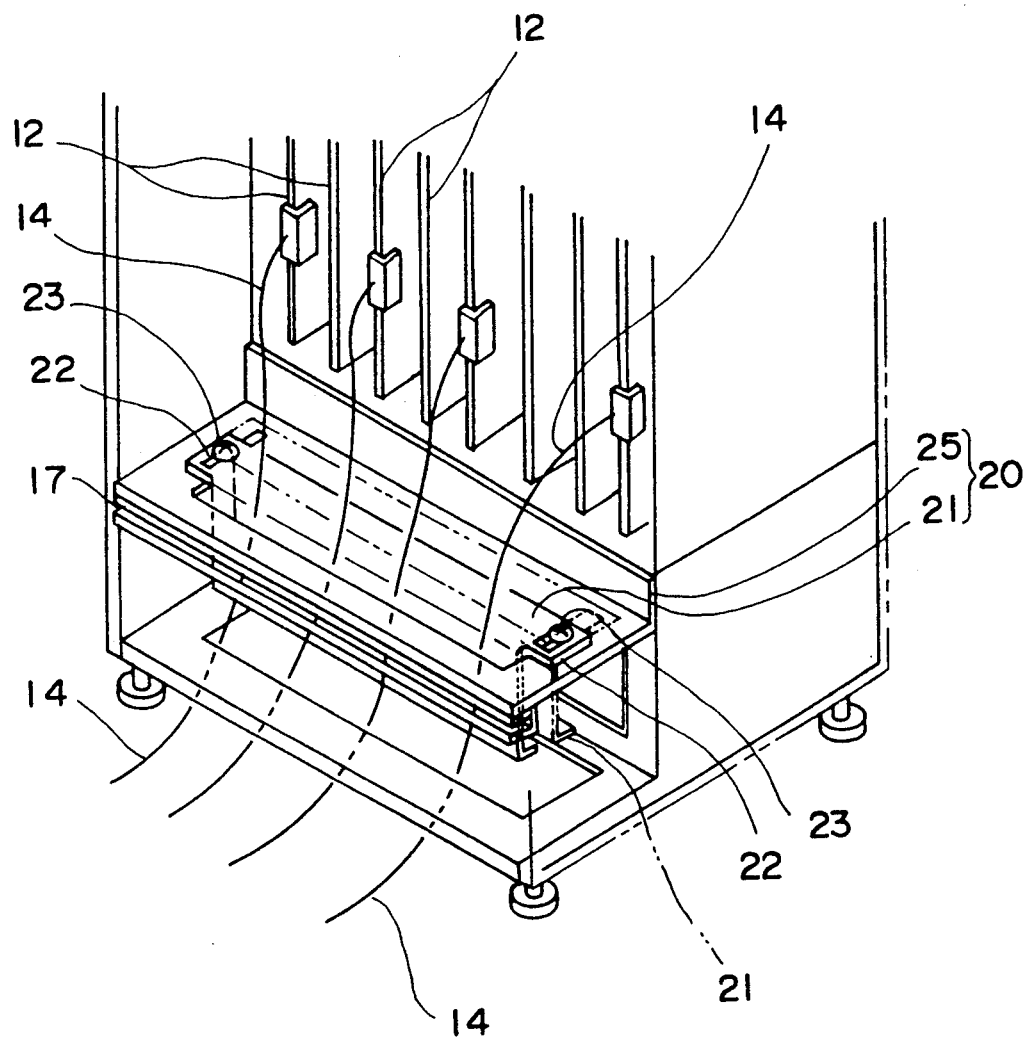
FIG. 2 is a perspective view of a main part of the electronic equipment of FIG. 1.
Figure 3:
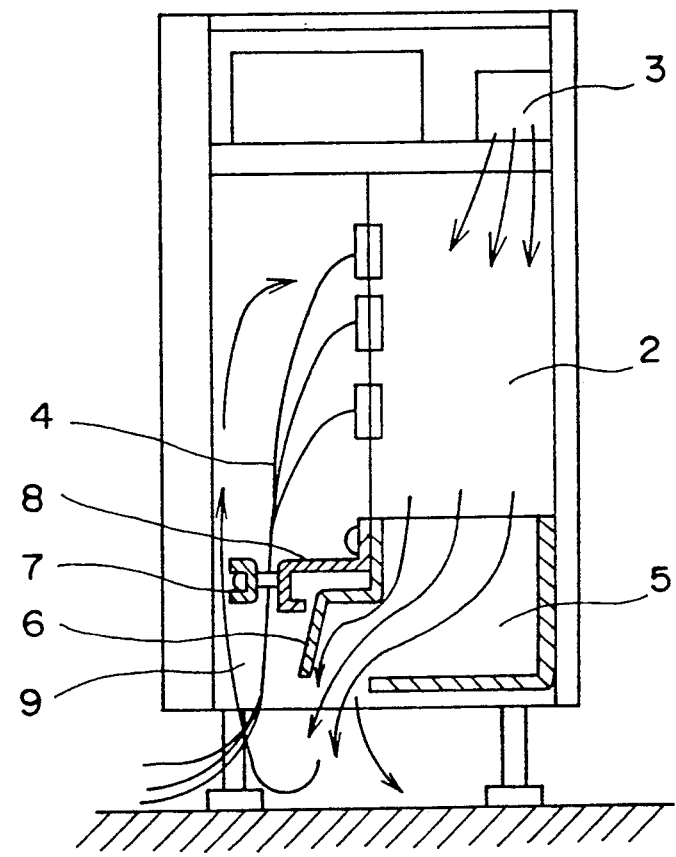
FIG. 3 is a cross-sectional view of a conventional electronic equipment.

In operation, if the number of the external connector cables 14 to be connected to the printed circuit boards 12 is large, the movable plate 21 is fastened to the stationary plate 25, for example, at a position indicated by dash-and-two-dot lines in FIGS. 1 and 2, so that the area of the lead-in opening 19 is increased to meet with the quantity of the external connector cables 14.

If the number of the external connector cables 14 is small, the screws 23, 23 fastening the movable plate 21 on the stationary plate 25 are loosened and then the movable plate 21 is moved in such a direction as to reduce the area of the lead-in opening 19, whereupon the screws 23, 23 are tightened to fasten the movable plate 21 again.

Since the area of the lead-in opening 19 can be varied according to the quantity of the external connector cables 14, it is possible to minimize the gaps between the cables in the lead-in opening 19, irrespective of the quantity of the external connector cables 14. As a result, substantially none of the hot air emitted from the exhaust duct 15 will flow backwardly into the electronic equipment via the lead-in opening 19, thus preventing the cooling efficiency from being lowered due to the recycling of the hot air.

In the illustrated embodiment, a part of the partition is movable. This invention, however, should by no means be limited to this specific example. For example, the entire partition may be movable. Alternatively, to prevent the backward flow of emitted hot air into the lead-in opening 19, a movable plate for varying only the area of the lead-in opening 19 may be provided. Further a part of the movable plate 21 may project out of the equipment so that the movable plate 21 can be manipulated from outside the equipment.

As stated above, according to the present invention, the opening area of the cable lead-in portion can be varied to meet with the quantity of the external connector cable, so that almost none of hot air emitted from the electronic equipment will flow backwardly into the equipment via the lead-in opening, thus preventing the cooling efficiency from being lowered due to the recycling of the hot air.

What is claimed is:

1. An apparatus for cooling electronic equipment comprising:
    a casing containing the electronic equipment having an exhaust opening and a lead-in opening adjacent thereto, said lead-in opening receiving at least one cable;
    air cooling means for causing cooling air to flow through the electronic equipment and to exit the casing via said exhaust opening; and
    a partition disposed between said exhaust opening and said lead-in opening, said partition defining and forming a boundary of both of said exhaust and lead-in openings, said partition being movable at least in part so as to vary the area of at least said lead-in opening to be substantially equal to the area of said at least one cable thereby substantially preventing air that has exited the casing via said exhaust opening from reentering the casing via said lead-in opening.

2. The apparatus according to claim 1 wherein the casing has at least a top and a bottom and wherein said exhaust opening and said lead-in opening are formed on said bottom.

3. The apparatus according to claim 1 further comprising a plurality of circuit boards located within the casing and having opposing ends arranged in parallel with one another, said plurality of circuit boards being respectively connected to said at least one cable through said lead-in opening;
    said air cooling means being disposed at one end of the plurality of circuit boards; and
    said exhaust opening being formed at the opposing end of the plurality of circuit boards.

4. The apparatus according to claim 1 wherein said partition comprises a stationary plate and a movable plate movably supported on the stationary plate.

5. The apparatus according to claim 4 wherein the moveable plate has a horizontal portion having opposing ends and a vertical portion projecting downwardly from one end of the horizontal portion.

6. The apparatus according to claim 5 wherein the horizontal portion of the movable plate has a pair of parallel slots in its opposing ends arranged so that the movable plate can be moved so as to vary both the area of said exhaust opening and said lead-in opening.

7. The apparatus according to claim 6 further comprising a locking mechanism for locking the movable part of said partition.

8. The apparatus according to claim 3 wherein the length of said lead-in opening in the direction perpendicular to planes formed by said plurality of circuit boards is at least equal to the length of the space occupied by the plurality of circuit boards in the direction perpendicular to the planes formed by the plurality of circuit boards.

9. The apparatus according to claim 8 wherein the length of said lead-in opening is defined by a slidable member to vary the area of said lead-in opening, which constitutes said partition.

* * * * *